(12) United States Patent
Liao et al.

(10) Patent No.: US 9,196,553 B2
(45) Date of Patent: Nov. 24, 2015

(54) SEMICONDUCTOR PACKAGE STRUCTURE AND MANUFACTURING METHOD THEREOF

(75) Inventors: Tsung-Jen Liao, Hsinchu (TW); Mei-Fang Peng, Hsinchu (TW); Cheng-Tang Huang, Hsinchu (TW)

(73) Assignee: ChipMOS Technologies Inc., Hsinchu (TW)

( * ) Notice: Subject to any disclaimer, the term of this patent is extended or adjusted under 35 U.S.C. 154(b) by 173 days.

(21) Appl. No.: 13/352,346

(22) Filed: Jan. 18, 2012

(65) Prior Publication Data

US 2013/0049197 A1     Feb. 28, 2013

(30) Foreign Application Priority Data

Aug. 25, 2011   (TW) .............................. 100130534 A

(51) Int. Cl.

| | | |
|---|---|---|
| H01L 23/60 | (2006.01) | |
| H01L 23/13 | (2006.01) | |
| H01L 23/498 | (2006.01) | |
| H01L 25/10 | (2006.01) | |
| H01L 21/683 | (2006.01) | |

(52) U.S. Cl.
CPC ............ H01L 23/13 (2013.01); H01L 21/6835 (2013.01); H01L 23/49816 (2013.01); H01L 23/49827 (2013.01); H01L 25/105 (2013.01); H01L 2221/68345 (2013.01); H01L 2221/68363 (2013.01); H01L 2224/16 (2013.01); H01L 2225/1041 (2013.01); H01L 2225/1058 (2013.01)

(58) Field of Classification Search
CPC ............................... H01L 23/498; H01L 21/60
USPC .......... 438/613, 611, 612; 257/678, 680, 686
See application file for complete search history.

(56) References Cited

U.S. PATENT DOCUMENTS

| 6,661,084 B1 * | 12/2003 | Peterson et al. .............. 257/680 |
|---|---|---|
| 2004/0026767 A1 * | 2/2004 | Sato et al. ...................... 257/678 |
| 2005/0212129 A1 * | 9/2005 | Huang et al. .................. 257/737 |
| 2006/0043568 A1 * | 3/2006 | Abe et al. ...................... 257/698 |
| 2008/0157358 A1 | 7/2008 | Yang |
| 2009/0302448 A1 * | 12/2009 | Huang .......................... 257/686 |
| 2010/0167471 A1 | 7/2010 | Jin et al. |
| 2011/0042800 A1 | 2/2011 | Hsu et al. |

OTHER PUBLICATIONS

"Office Action of China Counterpart Application", issued on Mar. 27, 2014, p. 1-p. 9.

\* cited by examiner

Primary Examiner — Thomas L Dickey
(74) Attorney, Agent, or Firm — Jianq Chyun IP Office

(57) ABSTRACT

A manufacturing method of semiconductor package structure includes: providing a first dielectric layer having multiple through holes; providing a second dielectric layer having multiple conductive vias and a chip-containing opening; laminating the second dielectric layer onto the first dielectric layer; disposing a chip in the chip-containing opening and adhering a rear surface of the chip onto the first dielectric layer exposed by the chip-containing opening; forming a redistribution circuit layer on the second dielectric layer wherein a part of the redistribution circuit layer extends from the second dielectric layer onto an active surface of the chip and the conductive vias so that the chip electrically connects the conductive vias through the partial redistribution circuit layer; forming multiple solder balls on the first dielectric layer wherein the solder balls are in the through holes and electrically connect the chip through the conductive vias and the redistribution circuit layer.

14 Claims, 3 Drawing Sheets

SEMICONDUCTOR PACKAGE STRUCTURE AND MANUFACTURING METHOD THEREOF

CROSS-REFERENCE TO RELATED APPLICATION

This application claims the priority benefit of Taiwan application serial no. 100130534, filed on Aug. 25, 2011. The entirety of the above-mentioned patent application is hereby incorporated by reference herein and made a part of this specification.

BACKGROUND OF THE INVENTION

1. Field of the Invention

The invention generally relates to a semiconductor component and a manufacturing method thereof, and more particularly, to a semiconductor package structure and a manufacturing method thereof.

2. Description of Related Art

The chip package is for protecting a bare die, reducing density of chip bonding spots and providing a chip with good heat-dissipating. When the count of chip contacts is ceaselessly increased and the chip area is made smaller and smaller with the development of semiconductor technology, it is difficult to re-distribute all contacts of a chip in area array scheme on the surface of the chip. Even though a chip surface can accommodate all the contacts thereof, the interval between contacts still gets too small so as to affect the electrical reliability as the successive soldering process of solder balls.

In this regard, the prior art provides a scheme that, first, a molding compound is used to package a chip for increasing the chip area, in which an active surface of the chip and a bottom surface of the molding compound are exposed out; then, a redistribution circuit layer is formed on the active surface of the chip and the bottom surface of the molding compound and multiple solder balls are formed respectively on the contacts of the redistribution circuit layer to serve as an electrically connecting medium between the chip and the external contacts. That is to say, the active surface of the chip and the solder balls are located on a same plane. However, it is easier to produce overflow during packaging, which leads the molding compound to extend onto a part of the active surface and increases the production fraction defective. Further, the molding compound would contaminate the active surface of the chip so that the above-mentioned packaging scheme is unable to be used in CMOS chip.

Moreover, in the prior art, the chip area is increased by means of packaging a chip with molding compound, the redistribution circuit layer is located only on the active surface of the chip and the surface of the molding compound, in which the surface of the molding compound and the active surface of the chip have a same direction so that multiple chips are unable to be stacked. As a result, the conventional scheme is unable to use vertical stacking method to package multiple semiconductor components (for example, multiple chips) in a same package structure. In this regard, how to effectively reduce the thickness and size of a package structure of multiple stacked chips and meanwhile look after the electrical reliability of the package structure has become a project to be solved in strong desire.

SUMMARY OF THE INVENTION

Accordingly, the invention is directed to a semiconductor package structure with better reliability and smaller package thickness.

The invention is also directed to a manufacturing method of semiconductor package structure for fabricating the above-mentioned semiconductor package structure.

The invention provides a manufacturing method of semiconductor package structure, which includes following steps. A first dielectric layer having a plurality of through holes is provided. A second dielectric layer having a plurality of conductive vias and a chip-containing opening is provided. The second dielectric layer is laminated onto the first dielectric layer, in which the conductive vias are disposed correspondingly to the through holes and the chip-containing opening exposes out a partial region of the first dielectric layer. A chip is disposed in the chip-containing opening and adheres onto the first dielectric layer exposed by the chip-containing opening, in which the chip has an active surface and a rear surface opposite to the active surface, and the rear surface of the chip adheres onto the first dielectric layer. A redistribution circuit layer is formed on the second dielectric layer, in which a part of the redistribution circuit layer extends from the second dielectric layer onto the active surface of the chip and the conductive vias so that the chip is electrically connected to the conductive vias through a part of the redistribution circuit layer. A plurality of solder balls are formed on the first dielectric layer, in which the solder balls are located in the through holes and the solder balls are electrically connected to the chip through the conductive vias and the redistribution circuit layer.

In an embodiment of the present invention, the above-mentioned manufacturing method further includes: prior to providing the first dielectric layer, providing a first carrier and disposing the first dielectric layer on the first carrier; and after forming the redistribution circuit layer, removing the first carrier.

In an embodiment of the present invention, the above-mentioned manufacturing method of semiconductor package structure further includes: prior to forming the solder balls on the first dielectric layer, providing a second carrier and transferring the first dielectric layer and the second dielectric layer laminated with the first dielectric layer onto the second carrier so that the chip is located between the first dielectric layer and the second carrier; and after forming the solder balls, removing the second carrier.

In an embodiment of the present invention, the above-mentioned manufacturing method of semiconductor package structure further includes: prior to laminating the second dielectric layer onto the first dielectric layer, forming an adhesive layer on the first dielectric layer and after laminating the second dielectric layer onto the first dielectric layer, the chip-containing opening exposes out a part of the adhesive layer and the chip adheres onto the first dielectric layer through the adhesive layer.

In an embodiment of the present invention, the above-mentioned manufacturing method of semiconductor package structure further includes: prior to forming the solder balls on the first dielectric layer, removing the adhesive layer located in the through holes.

In an embodiment of the present invention, the above-mentioned method of removing the adhesive layer located in the through holes includes plasma ashing.

In an embodiment of the present invention, the above-mentioned method of laminating the second dielectric layer onto the first dielectric layer includes thermal compression bonding.

In an embodiment of the present invention, a diameter of each of the through holes is greater than a diameter of each of the conductive vias.

In an embodiment of the present invention, a thickness of the second dielectric layer is greater than a thickness of the first dielectric layer.

In an embodiment of the present invention, the method of forming the through holes and the chip-containing opening includes laser drilling, mechanical drilling or punching.

In an embodiment of the present invention, the above-mentioned manufacturing method of semiconductor package structure further includes: prior to forming the solder balls on the first dielectric layer, spreading a soldering flux in the through holes.

The invention also provides a semiconductor package structure, which includes a first dielectric layer, a second dielectric layer, a chip, a redistribution circuit layer and a plurality of solder balls. The first dielectric layer has a plurality of through holes. The second dielectric layer is laminated on the first dielectric layer and has a plurality of conductive vias and a chip-containing opening, in which the conductive vias are disposed correspondingly to the through holes and the chip-containing opening exposes out a partial region of the first dielectric layer. The chip is disposed in the chip-containing opening and located on the first dielectric layer exposed by the chip-containing opening, in which the chip has an active surface and a rear surface opposite to the active surface, and the rear surface of the chip adheres onto the first dielectric layer. The redistribution circuit layer is disposed on the second dielectric layer and extends onto the active surface of the chip and the conductive vias, in which the chip is electrically connected to the conductive vias through a part of the redistribution circuit layer. The solder balls are disposed in the through holes on the first dielectric layer, in which the solder balls are electrically connected to the chip through the conductive vias and the redistribution circuit layer.

In an embodiment of the present invention, the above-mentioned semiconductor package structure further includes an adhesive layer disposed between the first dielectric layer and the second dielectric layer and between the chip-containing opening of the second dielectric layer and the chip, in which the second dielectric layer and the chip adhere onto the first dielectric layer through the adhesive layer.

In an embodiment of the present invention, a diameter of each of the above-mentioned through holes is greater than a hole diameter of each of the conductive vias.

In an embodiment of the present invention, a thickness of the above-mentioned second dielectric layer is greater than a thickness of the first dielectric layer.

In an embodiment of the present invention, the thickness of the above-mentioned first dielectric layer is less than or equal to 50 μm and the thickness of the second dielectric layer is less than or equal to 100 μm.

Based on the description above, the present invention uses a scheme that the first dielectric layer is laminated onto the second dielectric layer, the redistribution circuit layer is electrically connected to the chip through the conductive vias of the second dielectric layer and the chip is electrically connected to the solder balls through the conductive vias of the second dielectric layer and the redistribution circuit layer, wherein the solder balls are disposed in the through holes of the first dielectric layer. In this way, the semiconductor package structure of the invention has a smaller package thickness by design and a plurality of semiconductor package structures are able to be stacked in three-dimensional stacking layout so as to shorten the signal transmission path between the semiconductor package structures and to increase the electrical reliability by means of the design of the conductive vias, the redistribution circuit layer and the solder balls.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF THE EMBODIMENTS

Figure 1A:
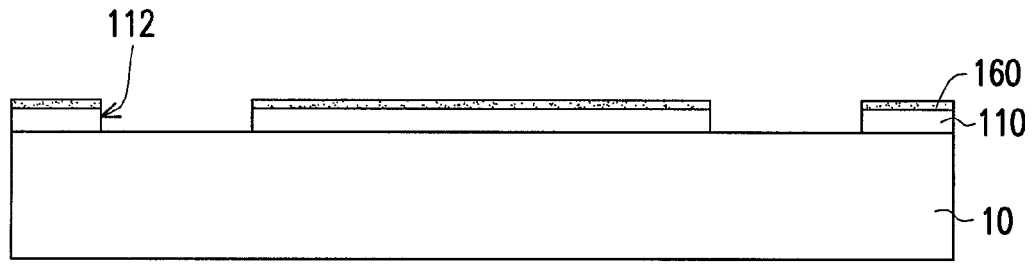
FIGS. 1A-1F are cross-sectional diagrams of a manufacturing method of semiconductor package structure according to an embodiment of the invention.

FIGS. 1A-1F are cross-sectional diagrams of a manufacturing method of semiconductor package structure according to an embodiment of the invention. Referring to FIG. 1A, the manufacturing method of semiconductor package structure of the embodiment includes following steps. First, a first carrier 10 and a first dielectric layer 110 are provided, in which the first dielectric layer 110 is disposed on the first carrier 10 and has a plurality of through holes 112. In the embodiment, the material of the first dielectric layer 110 is for example, bismaleimide-triazine resin (BT resin) and the method of forming the through holes 112 is, for example, laser drilling, mechanical drilling or punching. It should be noted that when the hardness of the first dielectric layer 110 is higher enough to serve as a supporting layer, the first carrier 10 can be saved. In other words, a user can optionally adopt the first carrier 10.

Next referring to FIG. 1A again, an adhesive layer 160 is formed on the first dielectric layer 110, in which the adhesive layer 160 is not disposed in the through holes 112.

Figure 1B:
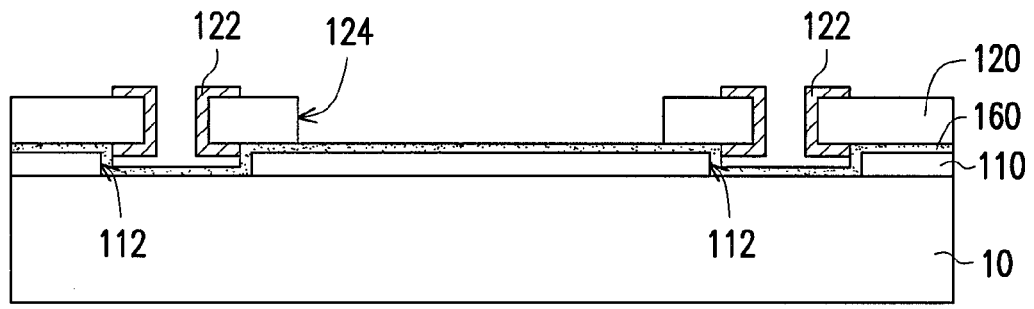

Then referring to FIG. 1B, a second dielectric layer 120 is provided, in which the second dielectric layer 120 has a plurality of conductive vias 122 and a chip-containing opening 124. The method of forming the chip-containing opening 124 is, for example, laser drilling, mechanical drilling or punching. Then, the second dielectric layer 120 are laminated onto the first dielectric layer 110, in which the conductive vias 122 are disposed correspondingly to the through holes 112 and the chip-containing opening 124 exposes out the adhesive layer 160 located on a partial region of the first dielectric layer 110.

In the embodiment, in particular, a diameter of each the through hole 112 is greater than a diameter of each the conductive via 122 and a thickness of the second dielectric layer 120 is, for example, greater than a thickness of the first dielectric layer 110, in which the thickness of the first dielectric layer 110 is, for example, less than or equal to 50 μm and the thickness of the second dielectric layer 120 is, for example, less than or equal to 100 μm. It should be noted that the method of laminating the second dielectric layer 120 onto the first dielectric layer 110 in the embodiment is, for example, thermal compression bonding. When the second dielectric layer 120 is laminated onto the first dielectric layer 110, a part of the adhesive layer 160 located on the first dielectric layer 110 would overflow into the through holes 112 due to the pressing between the first dielectric layer 110 and the second dielectric layer 120, and then, it is cured during heating, which combines the first dielectric layer 110 with the second dielectric layer 120 together.

Figure 1C:
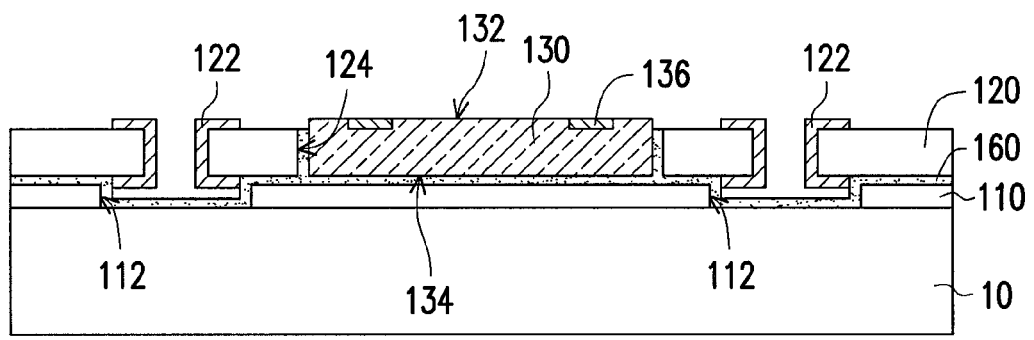

Then referring to FIG. 1C, a chip 130 is disposed in the chip-containing opening 124 of the second dielectric layer 120 and adheres to the adhesive layer 160 located on the first dielectric layer 110 and exposed by the chip-containing opening 124. The chip 130 adheres onto the first dielectric layer 110 through the adhesive layer 160. In more details, the chip 130 has an active surface 132 and a rear surface 134 opposite to the active surface 132 and a plurality of solder pads 136 located at the active surface 132, in which the rear surface 134 of the chip 130 adheres onto the adhesive layer 160 on the first dielectric layer 110. At the time, when the chip 130 is disposed in the chip-containing opening 124, a part of the adhesive layer 160 overflows to the surrounding surface of the chip 130 from the rear surface 134 of the chip 130, however, the overflow phenomena are not limited to the description above.

Figure 1D:
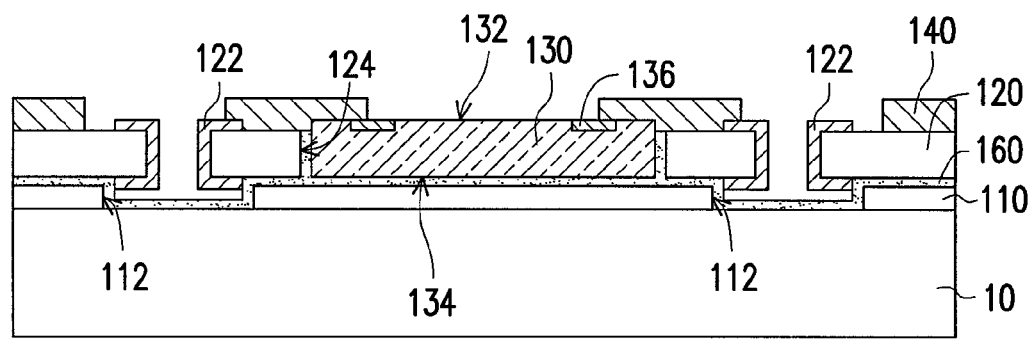

Then referring to FIG. 1D, a redistribution circuit layer 140 is formed on the second dielectric layer 120, in which a part of the redistribution circuit layer 140 extends onto the active surface 132 of the chip 130 and the conductive vias 122 from the second dielectric layer 120 so that the solder pads 136 located at the active surface 132 of the chip 130 are electrically connected to the conductive vias 122 through the partial redistribution circuit layer 140.

Figure 1E:
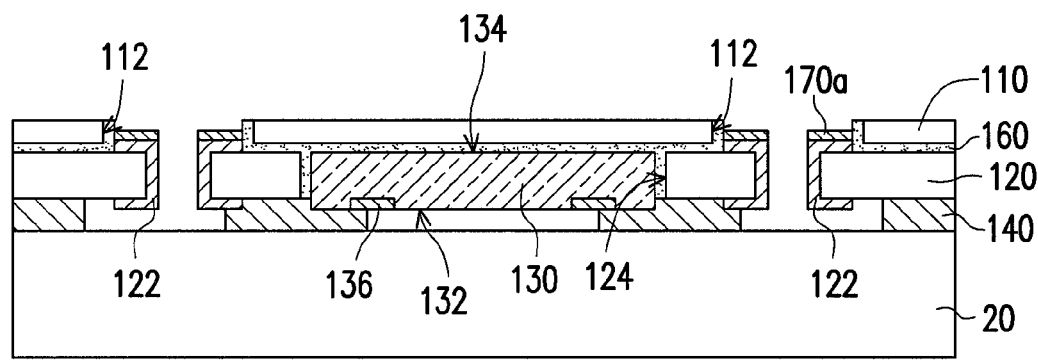

Then referring to FIG. 1E, the first carrier 10 is removed and a second carrier 20 is provided, followed by transferring the laminated first dielectric layer 110 and second dielectric layer 120 and the chip 130 onto the second carrier 20. At the time, the surface having the redistribution circuit layer 140 contacts the second carrier 20.

Figure 1F:
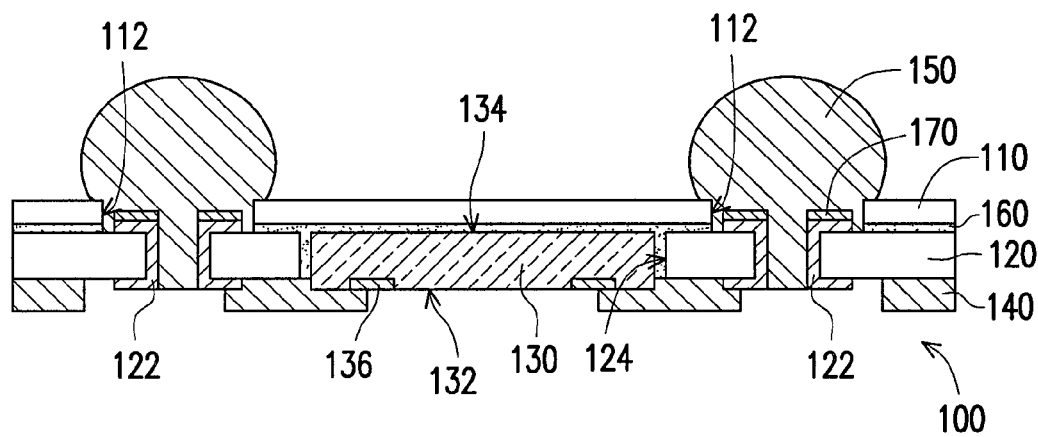

Then referring to FIG. 1F, the adhesive layer 160 located in the through holes 112 of the first dielectric layer 110 are removed, in which the method of removing the adhesive layer 160 in the through holes 112 is, for example, plasma ashing. After that, a plurality of solder balls 150 are formed on the first dielectric layer 110, in which the solder balls 150 are located in the through holes 112 and electrically connected to the chip 130 through the conductive vias 122 and the redistribution circuit layer 140. It should be noted that in order to increase the adsorption strength between the solder balls 150 and the through holes 112, prior to forming the solder balls 150, a soldering flux 170a can be spread in the through holes 112 (referring to FIG. 1E) and on the surfaces of the conductive vias 122 so as to facilitate shaping the solder balls 150 during reflow. Referring to FIG. 1F again, after the reflow, the soldering flux 170a is converted into a thin layer of residue, for example, greasy stain. Finally, the second carrier 20 is removed to expose out the redistribution circuit layer 140, and at the time, the fabrication of the semiconductor package structure 100 is finished.

Regarding the structure design, referring to FIG. 1F again, a semiconductor package structure 100 of the embodiment includes a first dielectric layer 110, a second dielectric layer 120, a chip 130, a redistribution circuit layer 140, a plurality of solder balls 150 and an adhesive layer 160. The first dielectric layer 110 has a plurality of through holes 112. The second dielectric layer 120 is stacked on the first dielectric layer 110 through the adhesive layer 160, and the second dielectric layer 120 has a plurality of conductive vias 122 and a chip-containing opening 124, in which the conductive vias 122 are disposed correspondingly to the through holes 112 and the chip-containing opening 124 exposes out a partial region of the first dielectric layer 110. In the embodiment, the diameter of each of the through holes 112 is greater than the diameter of each of the conductive via 122 and the thickness of the second dielectric layer 120 is greater than the thickness of the first dielectric layer 110, in which the thickness of the first dielectric layer 110 is, for example, less than or equal to 50 μm and the thickness of the second dielectric layer 120 is, for example, less than or equal to 100 μm. The chip 130 is disposed in the chip-containing opening 124 and located on the adhesive layer 160 located on the first dielectric layer 110 and exposed by the chip-containing opening 124. The chip 130 has an active surface 132 and a rear surface 134 opposite to the active surface 132 and the rear surface 134 of the chip 130 adheres onto the first dielectric layer 110 through the adhesive layer 160. The redistribution circuit layer 140 is disposed on the second dielectric layer 120 and extends onto the active surface 132 of the chip 130 and the conductive vias 122, in which the chip 130 is electrically connected to the conductive vias 122 through the partial redistribution circuit layer 140. The solder balls 150 are disposed in the through holes 112, in which the solder balls 150 are electrically connected to the chip 130 through the conductive vias 122 and the redistribution circuit layer 140. In addition, in order to increase the adsorption strength between the solder balls 150 and the through holes 112, a soldering flux 170a can be spread in the through holes 112 (referring to FIG. 1E), and after the reflow, the soldering flux 170a is converted into a thin layer of residue 170, for example, greasy stain. Then, the solder balls 150 are disposed in the through holes 112, which the invention is not limited to.

The embodiment uses the scheme of the second dielectric layer 120 thermally laminated onto the first dielectric layer 110, so that the redistribution circuit layer 140 is connected to the chip 130 through the conductive vias 122 of the second dielectric layer 120 and the chip 130 is connected to the solder balls 150 through the conductive vias 122 of the second dielectric layer 120 and the redistribution circuit layer 140. That is to say, the active surface 132 of the chip 130 and the solder balls 150 in the embodiment are respectively disposed on different opposite planes and the solder balls 150 are located in the through holes 112 of the first dielectric layer 110. And therefore, the semiconductor package structure 100 in the embodiment has a smaller package thickness by means of layout of the conductive vias 122 of the second dielectric layer 120, the chip 130 and the redistribution circuit layer 140. Moreover, in the semiconductor package structure 100 of the embodiment, the active surface 132 of the chip 130 and the solder balls 150 are respectively disposed on different opposite planes by design, so that the embodiment has more options of the type of the chip 130 and the package thereof. In the embodiment, the chip 130 is, for example, a CMOS chip.

Figure 2:
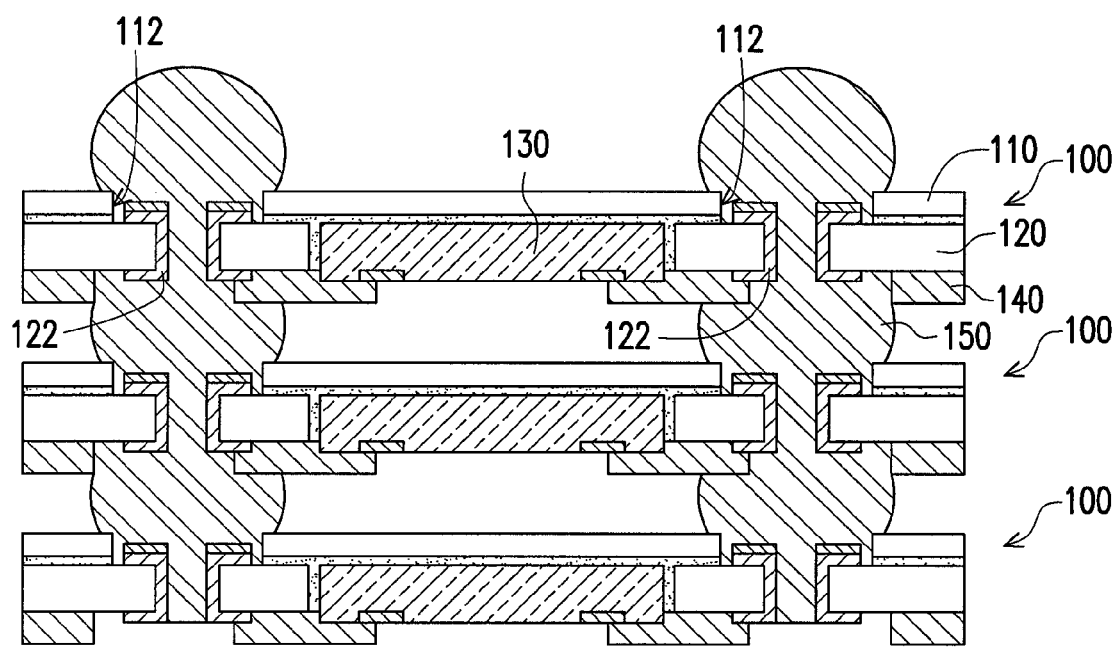
FIG. 2 is a cross-sectional diagram showing a stacked structure formed by stacking a plurality of semiconductor package structures in FIG. 1F.

FIG. 2 is a cross-sectional diagram showing a stacked structure formed by stacking a plurality of semiconductor package structures in FIG. 1F. Referring to FIG. 2, during stacking, the solder balls 150 of a semiconductor package structure 100 are connected onto the redistribution circuit layer 140 of another semiconductor package structure 100, so that the solder balls 150 of the previous semiconductor package structure 100 can be electrically connected to the solder balls 150 of the other semiconductor package structure 100 through the conductive vias 122 of the second dielectric layer 120 and the redistribution circuit layer 140 of the previous semiconductor package structure 100. In this way, the embodiment can effectively shorten the signal transmission path between the semiconductor package structures 100 so as to increase the signal transmission speed between components and the electrical reliability by means of the design of the conductive vias 122, the redistribution circuit layer 140 and the solder balls 150.

In summary, the present invention uses a scheme that the first dielectric layer is thermally laminated onto the second dielectric layer, and the redistribution circuit layer is connected to the chip through the conductive vias of the second dielectric layer and the chip is connected to the solder balls through the conductive vias of the second dielectric layer and the redistribution circuit layer, wherein the solder balls are disposed in the through holes of the first dielectric layer. In this way, the semiconductor package structure of the invention has a smaller package thickness by design and a plurality of semiconductor package structures are able to be stacked in three-dimensional stacking layout so as to shorten the signal transmission path between the semiconductor package structures and to increase the electrical reliability by means of the design of the conductive vias, the redistribution circuit layer and the solder balls.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A semiconductor package structure, comprising:
    a first dielectric layer having a plurality of through holes;
    a second dielectric layer laminated on the first dielectric layer and having a plurality of conductive vias and a chip-containing opening, wherein the second dielectric layer is directly adhered to the first dielectric layer, the conductive vias pass through the second dielectric layer, the conductive vias are disposed correspondingly to the through holes and the chip-containing opening exposes out a partial region of the first dielectric layer;
    a chip disposed in the chip-containing opening and located on a first surface of the first dielectric layer exposed by the chip-containing opening, wherein the chip has an active surface and a rear surface opposite to the active surface, and the rear surface of the chip adheres onto the first dielectric layer;
    an adhesive layer disposed between the first dielectric layer and the second dielectric layer and between the chip-containing opening of the second dielectric layer and the chip, wherein the second dielectric layer and the chip adhere onto the first dielectric layer through the adhesive layer;
    a redistribution circuit layer disposed on the second dielectric layer and extending onto the active surface of the chip and the conductive vias, wherein the chip is electrically connected to the conductive vias through a part of the redistribution circuit layer; and
    a plurality of solder balls disposed in the through holes on a second surface of the first dielectric layer, wherein the second surface of the first dielectric layer is opposite to the first surface of the first dielectric layer, a part of the solder balls fill into the conductive vias so as to be electrically connected to the chip through the conductive vias and the redistribution circuit layer.

2. The semiconductor package structure as claimed in claim 1, wherein a diameter of each of the through holes is greater than a diameter of each of the conductive vias.

3. The semiconductor package structure as claimed in claim 1, wherein a thickness of the second dielectric layer is greater than a thickness of the first dielectric layer.

4. The semiconductor package structure as claimed in claim 3, wherein the thickness of the first dielectric layer is less than or equal to 50 μm and the thickness of the second dielectric layer is less than or equal to 100 μm.

5. A manufacturing method of semiconductor package structure, comprising:
    providing a first dielectric layer having a plurality of through holes;
    providing a second dielectric layer having a plurality of conductive vias and a chip-containing opening, wherein the conductive vias pass through the second dielectric layer;
    prior to laminating the second dielectric layer onto the first dielectric layer, forming an adhesive layer on the first dielectric layer;
    laminating the second dielectric layer onto the first dielectric layer, wherein the second dielectric layer is directly adhered to the first dielectric layer, the conductive vias are disposed correspondingly to the through holes and the chip-containing opening exposes out a partial region of the first dielectric layer;
    disposing a chip in the chip-containing opening and adhering the chip onto a first surface of the first dielectric layer exposed by the chip-containing opening, wherein the chip has an active surface and a rear surface opposite to the active surface, and the rear surface of the chip adheres onto the first dielectric layer, wherein after laminating the second dielectric layer onto the first dielectric layer, the chip-containing opening exposes out a part of the adhesive layer and the chip adheres onto the first dielectric layer through the adhesive layer;
    forming a redistribution circuit layer on the second dielectric layer, wherein a part of the redistribution circuit layer extends from the second dielectric layer onto the active surface of the chip and the conductive vias so that the chip is electrically connected to the conductive vias through a part of the redistribution circuit layer; and
    forming a plurality of solder balls on a second surface of the first dielectric layer, wherein the second surface of the first dielectric layer is opposite to the first surface of the first dielectric layer, the solder balls are located in the through holes, and a part of the solder balls fill into the conductive vias during a reflow process so as to be electrically connected to the chip through the conductive vias and the redistribution circuit layer.

6. The manufacturing method of semiconductor package structure as claimed in claim 5, further comprising:
    prior to providing the first dielectric layer, providing a first carrier and disposing the first dielectric layer on the first carrier; and
    after forming the redistribution circuit layer, removing the first carrier.

7. The manufacturing method of semiconductor package structure as claimed in claim 6, further comprising:
    prior to forming the solder balls on the first dielectric layer, providing a second carrier and transferring the first dielectric layer and the second dielectric layer laminated with the first dielectric layer onto the second carrier so that the chip is located between the first dielectric layer and the second carrier; and
    after forming the solder balls, removing the second carrier.

8. The manufacturing method of semiconductor package structure as claimed in claim 5, further comprising:
    prior to forming the solder balls on the first dielectric layer, removing the adhesive layer located in the through holes.

9. The manufacturing method of semiconductor package structure as claimed in claim 8, wherein a method of removing the adhesive layer located in the through holes comprises plasma asking.

10. The manufacturing method of semiconductor package structure as claimed in claim 5, wherein a method of laminating the second dielectric layer onto the first dielectric layer comprises thermal compression bonding.

11. The manufacturing method of semiconductor package structure as claimed in claim 5, wherein a diameter of each of the through holes is greater than a diameter of each of the conductive vias.

12. The manufacturing method of semiconductor package structure as claimed in claim 5, wherein a thickness of the second dielectric layer is greater than a thickness of the first dielectric layer.

13. The manufacturing method of semiconductor package structure as claimed in claim 5, wherein a method of forming the through holes and the chip-containing opening comprises laser drilling, mechanical drilling or punching.

14. The manufacturing method of semiconductor package structure as claimed in claim 5, further comprising:
   prior to forming the solder balls on the first dielectric layer, spreading a soldering flux in the through holes.

\* \* \* \* \*